United States Patent
Sim et al.

(10) Patent No.: US 9,160,297 B2
(45) Date of Patent: Oct. 13, 2015

(54) COMMON MODE FILTER

(71) Applicant: SAMSUNG ELECTRO-MECHANICS CO., LTD., Suwon-si, Gyeonggi-do (KR)

(72) Inventors: Won Chul Sim, Suwon-si (KR); Chan Yoon, Suwon-si (KR); Young Seuck Yoo, Suwon-si (KR); Sung Kwon Wi, Suwon-si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/255,376

(22) Filed: Apr. 17, 2014

(65) Prior Publication Data

US 2014/0312992 A1    Oct. 23, 2014

(30) Foreign Application Priority Data

Apr. 17, 2013   (KR) .................. 10-2013-0042384

(51) Int. Cl.
*H03H 7/42*    (2006.01)

(52) U.S. Cl.
CPC ..................... *H03H 7/427* (2013.01)

(58) Field of Classification Search
CPC ... H01F 27/04; H01F 27/255; H01F 27/2847; H01F 27/306; H01F 27/323; H01F 27/325; H01F 27/38; H01F 27/40; H03H 7/00; H03H 7/01; H03H 7/0107; H03H 7/0115; H03H 7/0123; H03H 7/0138; H03H 7/0153; H03H 7/0161; H03H 7/075; H03H 7/09; H03H 7/12; H03H 7/17; H03H 7/1708; H03H 7/1716; H03H 7/1725; H03H 7/175; H03H 7/1758; H03H 7/1766; H03H 7/1775; H03H 7/1783; H03H 7/1791; H03H 7/19; H03H 7/38; H03H 7/42; H03H 7/425; H03H 7/427; H03H 7/46; H03H 7/463; H03H 7/48
USPC .................................................. 333/167, 185
See application file for complete search history.

(56) References Cited

U.S. PATENT DOCUMENTS 7,508,291 B2 * 3/2009 Matsumoto et al. .......... 336/200
2014/0232501 A1 * 8/2014 Kato ............................. 336/182

FOREIGN PATENT DOCUMENTS

| JP | 2000-277354 A | 10/2000 |
|---|---|---|
| JP | 2008-118059 A | 5/2008 |
| JP | 2012-015494 A | 1/2012 |
| JP | 2012-169410 A | 9/2012 |
| JP | 2013-012702 A | 1/2013 |
| KR | 10-2003-0068587 A | 8/2003 |
| KR | 10-2007-0061784 A | 6/2007 |

OTHER PUBLICATIONS

Korean Office Action issued in Korean Application No. 10-2013-0042384 dated May 27, 2014.

* cited by examiner

*Primary Examiner* — John Poos
*Assistant Examiner* — David Mattison
(74) *Attorney, Agent, or Firm* — McDermott Will & Emery LLP

(57) ABSTRACT

Disclosed herein is a common mode filter having improved insertion loss characteristics. The common mode filter includes: first and second coil electrode patterns formed at an upper layer and alternately disposed; and first and second coil electrode patterns formed at a lower layer and alternately disposed, wherein the outermost pattern of the upper layer and the outermost pattern of the lower layer are coil electrode patterns having the same order.

5 Claims, 4 Drawing Sheets

COMMON MODE FILTER

CROSS REFERENCE(S) TO RELATED APPLICATIONS

This application claims the benefit under 35 U.S.C. Section 119 of Korean Patent Application Serial No. 10-2013-0042384, entitled "Common Mode Filter" filed on Apr. 17, 2013, which is hereby incorporated by reference in its entirety into this application.

BACKGROUND OF THE INVENTION

1. Technical Field

The present invention relates to a common mode filter, and more particularly, to a structure of a coil electrode pattern in a common mode filter.

2. Description of the Related Art

In accordance with the development of a technology, electronic devices such as a portable phone, a home appliance, a personal computer (PC), a personal digital assistant (PDA), a liquid crystal display (LCD), and the like, have been changed from an analog scheme into a digital scheme and a speed of the electronic devices has increased due to an increase in an amount of processed data. Therefore, a universal serial bus (USB) 2.0, a USB 3.0, and a high-definition multimedia interface (HDMI) have been widely spread as a high speed signal transmitting interface and have been used in many digital devices such as a personal computer and a digital high-definition television.

These interfaces adopt a differential signal system transmitting differential signals (differential mode signals) using a pair of signal lines unlike a single-end transmitting system that has been generally used for a long period of time. However, electronic devices that are digitized and have an increased speed are sensitive to stimulus from the outside. That is, in the case in which a small abnormal voltage and high frequency noise are introduced from the outside into an internal circuit of the electronic device, a circuit may be damaged and a signal may be distorted.

In order to prevent the damage to the circuit of the electronic device and generation of the signal distortion, a filter is installed to prevent the high frequency noise from being introduced into the circuit. Generally, a common mode filter has been used in a high speed differential signal line, or the like, in order to remove common mode noise.

The common mode noise indicates noise generated in the differential signal line, and the common mode filter removes noise that may not be removed by an existing electromagnetic interference (EMI) filter. The common mode filter contributes to improvement in EMI characteristics of a home appliance, or the like, and improvement of antenna characteristics of a cellular phone, or the like.

Referring to Japanese Patent Laid-Open Publication No. 2012-015494, a general common mode filter according to the related art includes a metal-polymer composite filled around first and second coil electrode patterns enclosed by an insulating resin.

Here, the first and second coil electrode patterns are stacked while having the insulating resin therebetween in order to enhance electromagnetic coupling therebetween. Therefore, the first and second coil electrode patterns are disposed to face each other in a vertical direction.

RELATED ART DOCUMENT

Patent Document (Patent Document 1) Japanese Patent Laid-Open Publication No. 2012-015494

SUMMARY OF THE INVENTION

An object of the present invention is to provide a common mode filter having insertion loss characteristics improved as compared with the common mode filter according to the related art having the above-mentioned structure.

According to an exemplary embodiment of the present invention, there is provided a common mode filter including: first and second coil electrode patterns formed at an upper layer and alternately disposed; and first and second coil electrode patterns formed at a lower layer and alternately disposed, wherein the outermost pattern of the upper layer and the outermost pattern of the lower layer are coil electrode patterns having the same order.

The outermost pattern of the upper layer and the outermost pattern of the lower layer may be the first coil electrode patterns or the second coil electrode patterns.

The coil electrode patterns disposed at the upper layer and the lower layer and having the same order may have the centers positioned on the same line in a vertical direction or be overlapped with each other in the vertical direction, but have the centers misaligned with each other.

In the case in which the coil electrode patterns disposed at the upper layer and the lower layer and having the same order are overlapped with each other in the vertical direction, but have the centers misaligned with each other, a ratio (x/L) of a horizontal center interval x between the coil electrode patterns disposed at the upper layer and the lower layer and having the same order to a horizontal center interval L between the first and second coil electrode patterns may be less than 0.5.

In a range in which the coil electrode patterns of the upper layer and the coil electrode patterns of the lower layer do not contact each other, a ratio (h/w) of a vertical spaced distance h between the coil electrode patterns of the upper layer and the coil electrode patterns of the lower layer to a horizontal spaced distance w between the first and second coil electrode patterns may be 1.5 or less.

DESCRIPTION OF THE PREFERRED EMBODIMENTS

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art.

Terms used in the present specification are for explaining exemplary embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Figure 1:
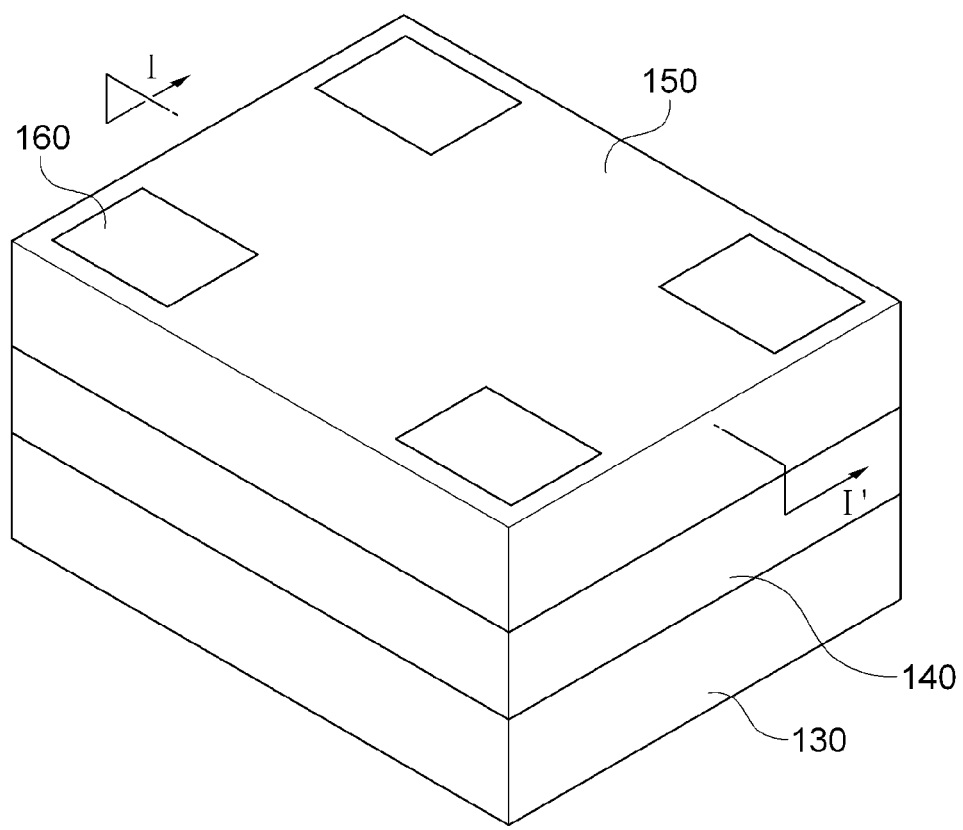
FIG. 1 is a perspective view of a common mode filter according to an exemplary embodiment of the present invention.
Figure 2:
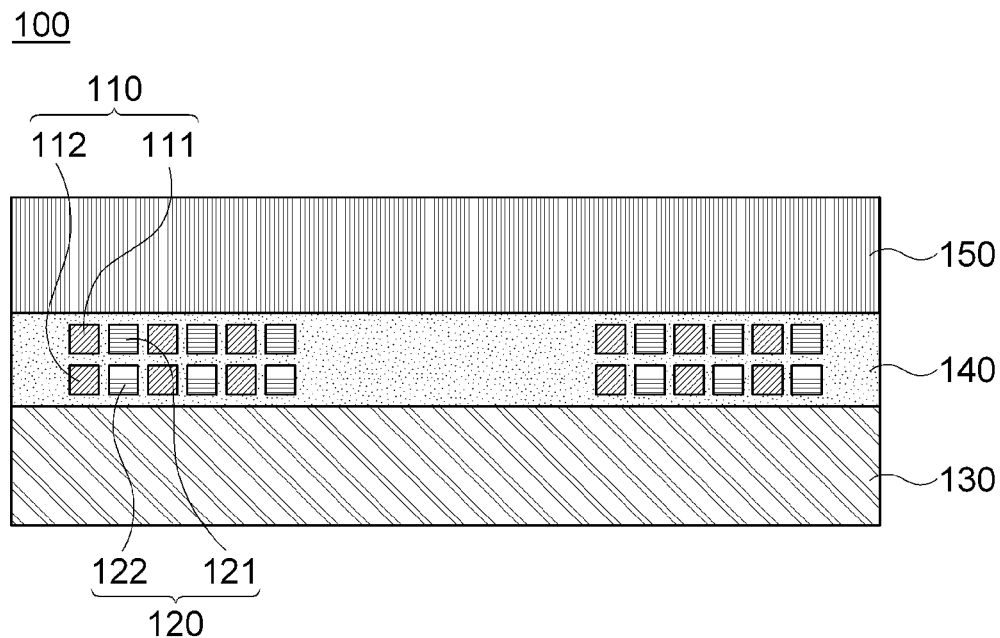
FIG. 2 is a cross-sectional view taken along the line I-I' of FIG. 1.

FIG. 1 is a perspective view of a common mode filter according to an exemplary embodiment of the present invention; and FIG. 2 is a cross-sectional view taken along the line I-I' of FIG. 1. Additionally, components shown in the accompanying drawings are not necessarily shown to scale. For example, sizes of some components shown in the accompanying drawings may be exaggerated as compared with other components in order to assist in the understanding of the exemplary embodiments of the present invention. Meanwhile, throughout the accompanying drawings, the same reference numerals will be used to describe the same components. For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure.

Referring to FIGS. 1 and 2, the common mode filter 100 according to the exemplary embodiment of the present invention may be configured to include first and second coil electrode patterns 110 and 120 that have alternately disposed patterns.

The first and second coil electrode patterns 110 and 120 are embedded in an insulating resin layer 140 stacked on a magnetic substrate 130, and a metal-polymer composite 150 is stacked on the insulating resin layer 140 to make a magnetic flux flow smooth.

Structures of the first and second coil electrode patterns 110 and 120 will be described below in detail. The first coil electrode pattern 110 includes first coil electrode patterns 111 formed at an upper layer and first coil electrode patterns 112 formed at a lower layer, and the second coil electrode pattern 120 also includes second coil electrode patterns 121 formed at the upper layer and second coil electrode patterns 122 formed at the lower layer.

Therefore, the first and second coil electrode patterns 111 and 121 may be alternately disposed at the upper layer, the first and second coil electrode patterns 112 and 122 may be alternately disposed at the lower layer, and the coil electrode patterns having the same order may be connected to each other by vias (not shown). In addition, both distal ends of the first and second coil electrode patterns 110 and 120 may be connected to external electrode terminals 160, respectively, to thereby be conducted to external circuits.

In this structure, the present invention is characterized in that the outermost pattern of the upper layer and the outermost pattern of the lower layer are the coil electrode patterns having the same order. For example, the outermost pattern of the upper layer and the outermost pattern of the lower layer may be the first coil electrode patterns 110 as shown in FIG. 2. Alternatively, the outermost pattern of the upper layer and the outermost pattern of the lower layer may be the second coil electrode patterns 120.

Here, the coil electrode patterns disposed at the upper layer and the lower layer and having the same order may have the centers positioned on the same line in a vertical direction.

That is, as shown in FIG. 2, the first coil electrode pattern 111 of the upper layer and the first coil electrode pattern 112 of the lower layer may be disposed to be positioned on the same line in the vertical direction. Likewise, the second coil electrode pattern 121 of the upper layer and the second coil electrode pattern 122 of the lower layer may be disposed to be positioned on the same line in the vertical direction.

Figure 3:
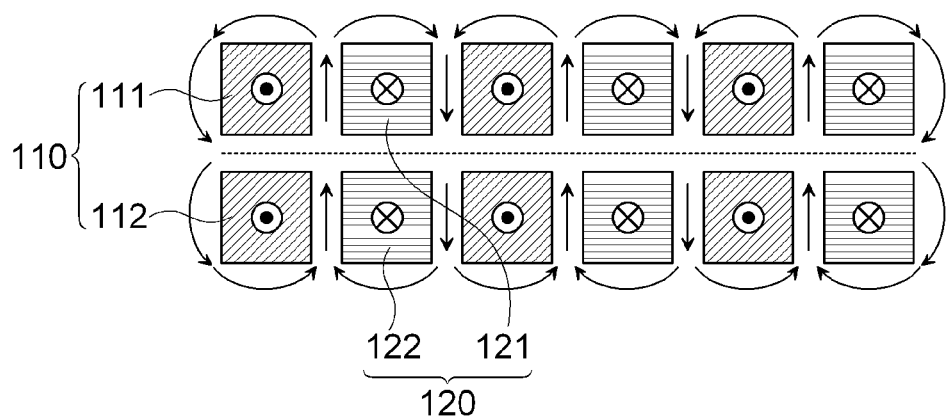
FIG. 3 is a view showing a magnetic flux flow generated in disposition of coil electrode patterns according to the exemplary embodiment of the present invention.

In FIG. 3 showing a magnetic flux flow around the coil electrode patterns in a structure in which the coil electrode patterns are disposed as described above, it is assumed that a current flows in the first and second coil electrode patterns 110 and 120 in different directions. That is, it is assumed that a current coming out of a paper flows in the first coil electrode pattern 110, and a current going into the paper flows in the second coil electrode pattern 120.

In this case, as shown in FIG. 3, magnetic fluxes between the first coil electrode pattern 111 of the upper layer and the first coil electrode pattern 112 of the lower layer (or magnetic fluxes between the second coil electrode pattern 121 of the upper layer and the second coil electrode pattern 122 of the lower layer) are offset against each other. As a result, differential mode impedance is decreased, such that insertion loss characteristics are improved.

Figure 4A:
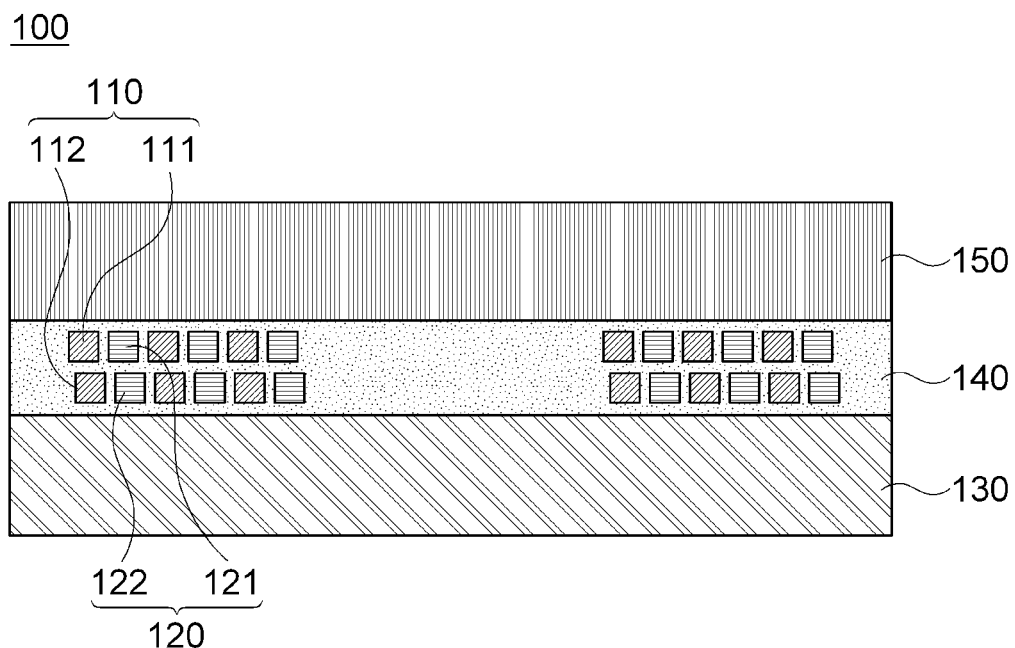
FIG. 4A is a cross-sectional view of a common mode filter according to another embodiment of the present invention.
Figure 4B:
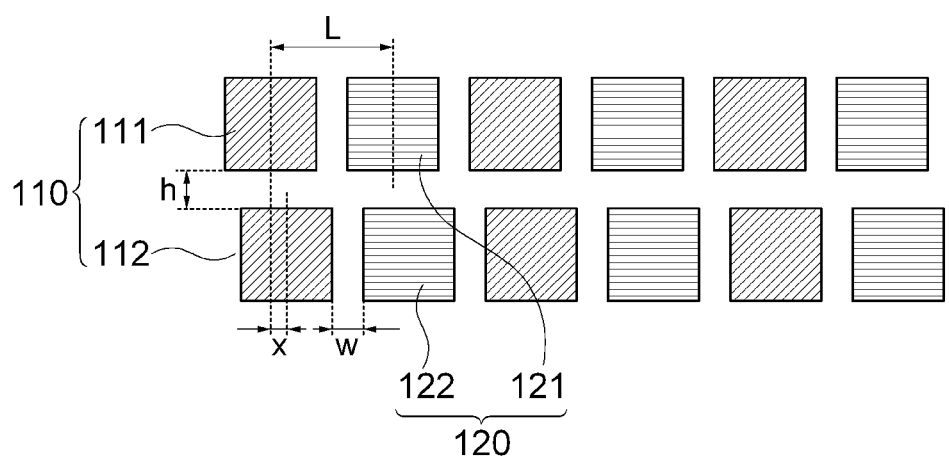
FIG. 4B is an enlarged view of the coil electrode patterns of FIG. 4A.

Meanwhile, the electrode patterns disposed at the upper layer and the lower layer and having the same order may be overlapped with each other in the vertical direction, but have the centers misaligned with each other, as shown in FIGS. 4A and 4B. That is, the first coil electrode pattern 111 of the upper layer and the first coil electrode pattern 112 of the lower layer are disposed so that they are overlapped with each other in the vertical direction, but have the centers misaligned with each other. Likewise, the second coil electrode pattern 121 of the upper layer and the second coil electrode pattern 122 of the lower layer are disposed so that they are overlapped with each other in the vertical direction, but have the centers misaligned with each other.

In this case, a ratio (x/L) of a horizontal center interval x between the coil electrode patterns disposed at the upper layer and the lower layer and having the same order to a horizontal center interval L between the first and second coil electrode patterns may be less than 0.5.

Figure 5:
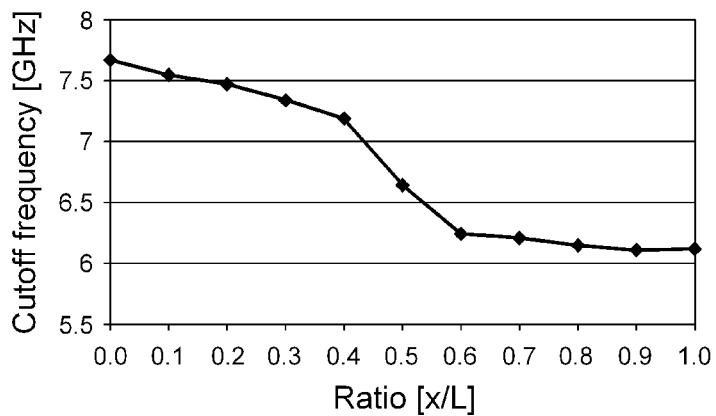
FIG. 5 is a graph showing characteristic values depending on x/L.

The following Table 1 is a table showing characteristic values depending on x/L, and FIG. 5 is a graph showing the characteristic values.

TABLE 1

| Ratio [x/L] | CM_Impedance [$\Omega$] | Cutoff frequency [GHz] |
|---|---|---|
| 0.0 | 33.33 | 7.674 |
| 0.1 | 33.39 | 7.551 |
| 0.2 | 33.42 | 7.479 |
| 0.3 | 33.44 | 7.345 |
| 0.4 | 33.48 | 7.202 |
| 0.5 | 33.5 | 6.653 |

TABLE 1-continued

| Ratio [x/L] | CM_Impedance [Ω] | Cutoff frequency [GHz] |
|---|---|---|
| 0.6 | 33.51 | 6.242 |
| 0.7 | 33.53 | 6.211 |
| 0.8 | 33.55 | 6.152 |
| 0.9 | 33.53 | 6.109 |
| 1.0 | 33.51 | 6.124 |

Here, when x/L is 0.0, a horizontal central interval x between the first coil electrode pattern 111 of the upper layer and the first coil electrode pattern 112 of the lower layer (or the second coil electrode pattern 121 of the upper layer and the second coil electrode pattern 122 of the lower layer) is 0, which corresponds to the same structure as the structure shown in FIG. 2.

In addition, when x/L is 1.0, the centers of the first coil electrode pattern 111 of the upper layer and the second coil electrode pattern 122 of the lower layer (or the second coil electrode pattern 121 of the upper layer and the first coil electrode pattern of the lower layer) are positioned on the same line in the vertical direction.

It could be appreciated from Table 1 and FIG. 5 that as x/L becomes close to 1, common mode impedance (CM_Impedance) is hardly changed, but a cutoff frequency (Cutoff frequency) is decreased and is suddenly decreased, particularly starting with the case in which x/L is 0.5.

It could be confirmed that in the case in which the coil electrode patterns of the common mode filter are disposed in a structure of FIG. 2 or FIGS. 4A and 4B as described above, magnetic fluxes around the first and second coil electrode patterns 110 and 120 more organically interact with each other, such that the cutoff frequency is maintained as a constant value without a change in the common mode impedance, thereby improving the insertion loss characteristics.

Meanwhile, in the structure of the coil electrode patterns of FIG. 2 or FIGS. 4A and 4B, a ratio (h/w) of a vertical spaced distance h between the coil electrode patterns 111 and 121 of the upper layer and the coil electrode patterns 112 and 122 of the lower layer to a horizontal spaced distance w between the first and second coil electrode patterns 110 and 120 may be 1.5 or less.

Here, when h/w is 0, it means that the coil electrode patterns 111 and 121 of the upper layer and the coil electrode patterns 112 and 122 of the lower layer contact each other. Therefore, it is assumed that the above numeral range is a range in which h/w exceeds 0, that is, a range in which the coil electrode patterns 111 and 121 of the upper layer and the coil electrode patterns 112 and 122 of the lower layer do not contact each other.

Figure 6:
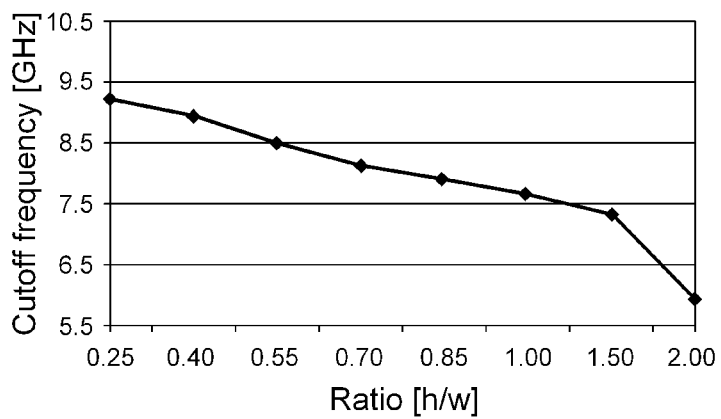
FIGS. 6 and 7 are graphs showing characteristic values depending on h/w.
Figure 7:
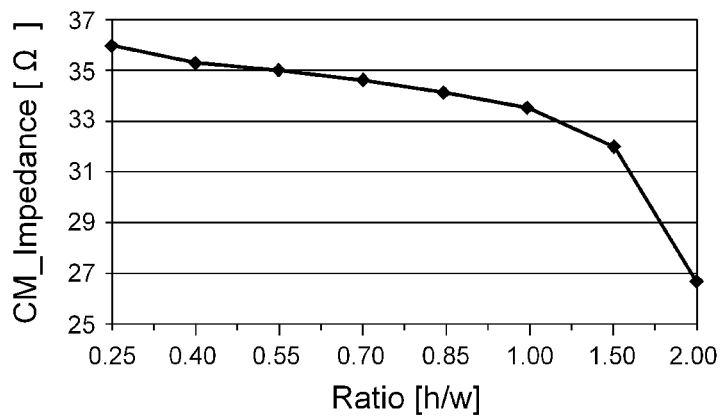

The following Table 2 is a table showing characteristic values depending on h/w, and FIGS. 6 and 7 are graphs showing the characteristic values.

TABLE 2

| Ratio [h/w] | CM_Impedance [Ω] | Cutoff frequency [GHz] |
|---|---|---|
| 0.25 | 35.78 | 9.3128 |
| 0.40 | 35.22 | 8.995 |
| 0.55 | 34.83 | 8.531 |
| 0.70 | 33.43 | 8.185 |
| 0.85 | 33.99 | 7.925 |

TABLE 2-continued

| Ratio [h/w] | CM_Impedance [Ω] | Cutoff frequency [GHz] |
|---|---|---|
| 1.00 | 33.33 | 7.674 |
| 1.50 | 31.86 | 7.345 |
| 2.00 | 26.67 | 5.961 |

It could be confirmed from Table 2 and FIGS. 6 and 7 that as h/w becomes close to 0.25, that is, the coil electrode patterns 111 and 121 of the upper layer and the coil electrode patterns 112 and 122 of the lower layer become close to each other, a cutoff frequency (Cutoff frequency) and common mode impedance (CM_Impedance) are increased, and when h/w exceeds 1.50, the cutoff frequency and the common mode impedance are suddenly decreased.

The reason is that as the coil electrode patterns 111 and 121 of the upper layer and the coil electrode patterns 112 and 122 of the lower layer become close to each other, loss of magnetic fluxes between the coil electrode patterns 111 and 121 of the upper layer and the coil electrode patterns 112 and 122 of the lower layer is decreased, and particularly, a mutual effect between the first and second coil electrode patterns 110 and 120 adjacent to each other in a diagonal direction is further increased.

The magnetic fluxes around the coil electrode patterns more organically interact by the structure of the coil electrode patterns included in the common mode filter according to the exemplary embodiment of the present invention, thereby making it possible to further improve the insertion loss characteristics as compared with a common mode filter according to the related art.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A common mode filter comprising:
   first and second coil electrode patterns formed at an upper layer and alternately disposed; and
   first and second coil electrode patterns formed at a lower layer and alternately disposed,
   wherein the outermost pattern of the upper layer and the outermost pattern of the lower layer are coil electrode patterns having the same order, and the coil electrode patterns disposed at the upper layer and the lower layer and having the same order are overlapped with each other in the vertical direction, but have the centers misaligned with each other.

2. The common mode filter according to claim 1, wherein the outermost pattern of the upper layer and the outermost pattern of the lower layer are the first coil electrode patterns.

3. The common mode filter according to claim 1, wherein the outermost pattern of the upper layer and the outermost pattern of the lower layer are the second coil electrode patterns.

4. The common mode filter according to claim 1, wherein a ratio (x/L) of a horizontal center interval x between the coil electrode patterns disposed at the upper layer and the lower layer and having the same order to a horizontal center interval L between the first and second coil electrode patterns is less than 0.5.

5. The common mode filter according to claim 1, wherein in a range in which the coil electrode patterns of the upper layer and the coil electrode patterns of the lower layer do not contact each other, a ratio (h/w) of a vertical spaced distance h between the coil electrode patterns of the upper layer and the coil electrode patterns of the lower layer to a horizontal spaced distance w between the first and second coil electrode patterns is 1.5 or less.

\* \* \* \* \*